United States Patent
Khlat

(10) Patent No.: US 9,078,211 B2
(45) Date of Patent: Jul. 7, 2015

(54) POWER MANAGEMENT CONFIGURATION FOR TX MIMO AND UL CARRIER AGGREGATION

(71) Applicant: RF Micro Devices, Inc., Greensboro, NC (US)

(72) Inventor: Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 30 days.

(21) Appl. No.: 14/052,221

(22) Filed: Oct. 11, 2013

(65) Prior Publication Data

US 2014/0106693 A1   Apr. 17, 2014

Related U.S. Application Data

(60) Provisional application No. 61/712,465, filed on Oct. 11, 2012.

(51) Int. Cl.
 *H04B 1/04* (2006.01)
 *H04W 52/02* (2009.01)
 *H03C 1/62* (2006.01)

(52) U.S. Cl.
 CPC ............ *H04W 52/0206* (2013.01); *Y02B 60/50* (2013.01)

(58) Field of Classification Search
 CPC ....... H04B 1/0483; H04B 1/406; H03F 2/211
 USPC ........................................... 455/127.3, 127.4
 See application file for complete search history.

(56) References Cited

U.S. PATENT DOCUMENTS

| | | | |
|---|---|---|---|
| 4,498,057 A | 2/1985 | Noro | |
| 5,502,422 A | 3/1996 | Newell et al. | |
| 6,091,970 A | 7/2000 | Dean | |
| 6,128,474 A | 10/2000 | Kim et al. | |
| 6,405,018 B1 | 6/2002 | Reudink et al. | |
| 7,187,945 B2 | 3/2007 | Ranta et al. | |
| 7,212,788 B2 | 5/2007 | Weber et al. | |
| 7,251,499 B2 | 7/2007 | Ellä et al. | |
| 7,864,491 B1 | 1/2011 | Bauder et al. | |
| 7,872,547 B2 | 1/2011 | Song et al. | |
| 7,973,646 B2 | 7/2011 | Chen et al. | |
| 7,996,003 B2 | 8/2011 | Maeda et al. | |
| 8,208,867 B2 | 6/2012 | Lum et al. | |
| 8,437,438 B2 | 5/2013 | Kuwahara | |

(Continued)

OTHER PUBLICATIONS

Non-Final Office Action for U.S. Appl. No. 13/852,309, mailed Oct. 14, 2014, 10 pages.

(Continued)

*Primary Examiner* — Lee Nguyen
(74) *Attorney, Agent, or Firm* — Withrow & Terranova, P.L.L.C.

(57) ABSTRACT

A communication device is disclosed that efficiently manages power. In one embodiment, this communication device includes a first (main) transmitter including a first low band amplifier and a first high band amplifier; a second (MIMO) transmitter including a second low band amplifier and a second high band amplifier; a first power manager in communication with the first low band amplifier and with the second high band amplifier; a second power manager in communication with the first high band amplifier and with the second low band amplifier; and a control system in communication with the first transmitter, the second transmitter, the first power manager, and the second power manager.

21 Claims, 6 Drawing Sheets

FIRST EMBODIMENT

(56) References Cited

U.S. PATENT DOCUMENTS

| | | |
|---|---|---|
| 8,565,701 B2 | 10/2013 | Sanchez et al. |
| 8,571,489 B2 | 10/2013 | Mikhemar et al. |
| 8,634,029 B2 | 1/2014 | Pugel |
| 8,718,582 B2 * | 5/2014 | See et al. .................. 455/127.3 |
| 8,774,065 B2 | 7/2014 | Khlat et al. |
| 8,774,067 B2 | 7/2014 | Rousu et al. |
| 2005/0245202 A1 | 11/2005 | Ranta et al. |
| 2005/0277387 A1 | 12/2005 | Kojima et al. |
| 2006/0012425 A1 | 1/2006 | Ohnishi et al. |
| 2006/0025171 A1 | 2/2006 | Ly et al. |
| 2006/0240785 A1 | 10/2006 | Fischer |
| 2006/0276132 A1 | 12/2006 | Sheng-Fuh et al. |
| 2006/0293005 A1 * | 12/2006 | Hara et al. ................ 455/127.4 |
| 2007/0280185 A1 | 12/2007 | McFarland et al. |
| 2008/0003797 A1 | 1/2008 | Kim |
| 2009/0180403 A1 | 7/2009 | Tudosoiu |
| 2009/0303007 A1 | 12/2009 | Ryou et al. |
| 2010/0099366 A1 | 4/2010 | Sugar et al. |
| 2010/0291888 A1 * | 11/2010 | Hadjichristos et al. .... 455/127.4 |
| 2011/0241782 A1 | 10/2011 | Clifton |
| 2011/0241787 A1 | 10/2011 | Mastovich |
| 2011/0250926 A1 | 10/2011 | Wietfeldt et al. |
| 2012/0235735 A1 | 9/2012 | Spits et al. |
| 2012/0281597 A1 | 11/2012 | Khlat et al. |
| 2013/0320803 A1 | 12/2013 | Maeda |
| 2013/0321095 A1 | 12/2013 | Lam et al. |
| 2013/0336181 A1 | 12/2013 | Khlat et al. |
| 2013/0337752 A1 | 12/2013 | Khlat |
| 2013/0337754 A1 | 12/2013 | Khlat |
| 2014/0015731 A1 | 1/2014 | Khlat et al. |
| 2014/0024322 A1 | 1/2014 | Khlat |
| 2014/0024329 A1 | 1/2014 | Khlat |
| 2014/0038675 A1 | 2/2014 | Khlat et al. |
| 2014/0051372 A1 | 2/2014 | Shoshan et al. |
| 2014/0073371 A1 | 3/2014 | Mujtaba et al. |
| 2014/0092795 A1 | 4/2014 | Granger-Jones |
| 2014/0227982 A1 | 8/2014 | Granger-Jones et al. |

OTHER PUBLICATIONS

Non-Final Office Action for U.S. Appl. No. 13/944,972, mailed Nov. 13, 2014, 10 pages.

Author Unknown, "3rd Generation Partnership Project; Technical Specification Group Radio Access Network; Evolved Universal Terrestrial Radio Access (E-UTRA); User Equipment (UE) Radio Transmission and Reception (Release 11)," Technical Specification 36.101, Version 11.1.0, Jun. 2012, 3GPP Organizational Partners, 336 pages.

Author Unknown, "MIPI Alliance Application Note for Analog Control Interface—Envelope Tracking," ACI-ET, Version 1.0.0, Release 19, Oct. 4, 2012, 1 page.

Djoumessi, Erick Emmanuel, et al., "Electronically Tunable Diplexer for Frequency-Agile Transceiver Front-End," 2010 IEEE MTT-S International Microwave Symposium Digest (MTT), May 23-28, 2010, pp. 1472-1475.

Valkenburg, M.E., Van. "12.2 Pole Reciprocation." Analog Filter Design. New York: CBS College Publishing, 1982. pp. 327-333.

Wang, Zhao-Ming, et al., "The Design of a Symmetrical Diplexer Composed of Canonical Butterworth Two-Port Networks," 1988 IEEE International Symposium on Circuits and Systems, vol. 2, Jun. 7-9, 1988, pp. 1179-1182.

Williams, Arthur Bernard, et al. Electronic Filter Design Handbook, 3rd. ed. New York: McGraw-Hill, 1995. pp. 3.1-4.7 and 11.72-11.73.

Zverev, Anatol I. Handbook of Filter Synthesis New York: John Wiley & Sons, 1967. pp. 192-193.

Notice of Allowance for U.S. Appl. No. 13/460,861, mailed Jan. 30, 2014, 9 pages.

Notice of Allowance for U.S. Appl. No. 13/045,604, mailed May 17, 2013, 11 pages.

Non-Final Office Action for U.S. Appl. No. 13/045,621, mailed May 31, 2013, 13 pages.

Notice of Allowance for U.S. Appl. No. 13/045,621, mailed Sep. 24, 2013, 10 pages.

Non-Final Office Action for U.S. Appl. No. 13/852,527, mailed Sep. 30, 2014, 19 pages.

Final Office Action for U.S. Appl. No. 13/852,527, mailed Jan. 12, 2015, 21 pages.

Non-Final Office Action for U.S. Appl. No. 13/942,778, mailed Jan. 22, 2015, 5 pages.

Final Office Action for U.S. Appl. No. 13/852,309, mailed Feb. 18, 2015, 12 pages.

Non-Final Office Action for U.S. Appl. No. 13/929,987, mailed Jan. 30, 2015, 11 pages.

Non-Final Office Action for U.S. Appl. No. 13/852,527, mailed Apr. 23, 2015, 23 pages.

Notice of Allowance for U.S. Appl. No. 13/942,778, mailed May 14, 2015, 10 pages.

Notice of Allowance for U.S. Appl. No. 13/944,972, mailed Apr. 13, 2015, 7 pages.

Non-Final Office Action for U.S. Appl. No. 14/051,601, mailed May 5, 2015, 6 pages.

* cited by examiner

CONVENTIONAL CIRCUITRY

FIRST EMBODIMENT

SECOND EMBODIMENT (UL CA)

THIRD EMBODIMENT
(UL MIMO FOR LOW BANDS)

FOURTH EMBODIMENT
(UL MIMO FOR HIGH BANDS)

SHUTTING OFF AMPLIFIER A1

POWER MANAGEMENT CONFIGURATION FOR TX MIMO AND UL CARRIER AGGREGATION

RELATED APPLICATIONS

This application claims the benefit of provisional patent application Ser. No. 61/712,465, filed Oct. 11, 2012, the disclosure of which is hereby incorporated by reference in its entirety.

FIELD OF THE DISCLOSURE

This application is directed to the field of power management for a communication device, especially for carrier aggregation and for transmit MIMO (multiple input, multiple output).

BACKGROUND

Conventional communication devices have a main (or first) transmitter powered by a dedicated first power manager and a MIMO (or second) transmitter powered by a dedicated second power manager. See FIG. 1 and the related detailed discussion.

This conventional layout requires that the first power manager simultaneously powers all amplifiers in the first transmitter, and requires that the second transmitter simultaneously powers all amplifiers in the second transmitter.

This conventional layout has a problem because it is impossible to independently power (with different voltages) different amplifiers in the same transmitter. For example, if the first transmitter has a first amplifier for low bands and a second amplifier for high bands, then it is impossible to provide a high power voltage to the low band amplifier while simultaneously providing a low power level to the high band amplifier (and vice-versa).

Therefore, this conventional layout is very inefficient when performing uplink carrier aggregation transmissions and uplink MIMO transmissions.

SUMMARY

In one embodiment, a communication device contains at least the following major components: a first (main) transmitter including a first low band amplifier and a first high band amplifier; a second (MIMO) transmitter including a second low band amplifier and a second high band amplifier; a first power manager in communication with the first low band amplifier and with the second high band amplifier; a second power manager in communication with the first high band amplifier and with the second low band amplifier; and a control system in communication with the first transmitter, the second transmitter, the first power manager, and the second power manager.

In one embodiment for uplink carrier aggregation, the control system is configured to provide a first power voltage from the first power manager to the first low band amplifier; and to provide a second power voltage (not equal to the first power voltage) from the second power manager to the first high band amplifier.

In one embodiment for low band uplink MIMO, the control system is configured to provide a first power voltage from the first power manager to the first low band amplifier, and to provide a second power voltage from the second power manager to the second low band amplifier.

In one embodiment for high band uplink MIMO, the control system is configured to provide a first power voltage from the first power manager to the second high band amplifier, and to provide a second power voltage from the second power manager to the first high band amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE FIGURES

The accompanying figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying figures, those skilled in the art will understand the concepts of the disclosure and will recognize applications of these concepts not particularly addressed herein. It should be understood that these concepts and applications fall within the scope of the disclosure and the accompanying claims.

The accompanying figures incorporated in and forming a part of this specification illustrate several aspects of the disclosure, and together with the description serve to explain the principles of the disclosure.

Figure 1:
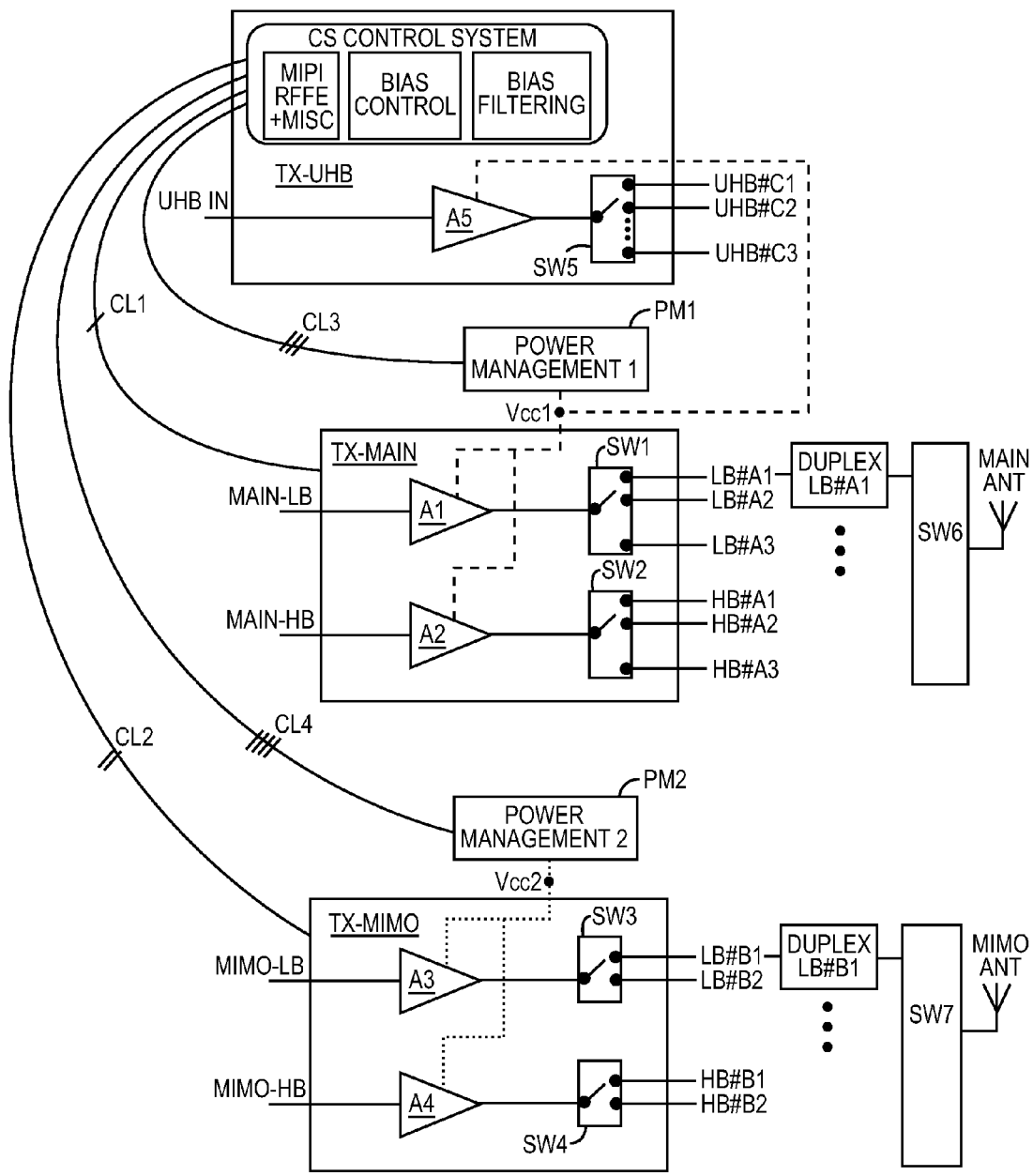
FIG. 1 illustrates conventional circuitry.

FIG. 1 illustrates conventional circuitry. FIG. 1 illustrates these major components (from top to bottom): a control system CS, a first power manager PM1, a main (first) transmitter TX-MAIN, a second power manager PM2, and a MIMO (second) transmitter TX-MIMO.

UHB (ultrahigh band) transmitter TX-UHB includes the control system CS, an ultrahigh band amplifier A5, and an ultrahigh band switch SW5. The ultrahigh band amplifier A5 receives an ultrahigh band signal UHB IN, outputs an amplified signal to switch SW5, and switch SWF outputs an amplified ultrahigh band signal UHB#C1, UHB#C2, or UHB#C3 (depending upon the selection of switch SW5).

The control system CS may include circuitry labeled: MIPI RFFE+MISC for processing RF (radio-frequency) front end signals; BIAS CONTROL for controlling bias of amplifiers; and BIAS FILTERING for filtering signals. The control system CS communicates through control lines CL1 to the main transmitter TX-MAIN, through control lines CL2 to MIMO transmitter TX-MIMO, through control lines CL3 to first power manager PM1, and through control lines CL4 to second power manager PM2.

Main transmitter TX-MAIN includes a first low band amplifier A1 receiving a first low band signal MAIN-LB and outputting an amplified first low band signal to switch SW1. Switch SW1 outputs the received signal to LB#A1, LB#A2, or LB#A3 depending upon the selection of switch SW1.

First duplexer DUPLEX LB#A1 receives signal LB#A1 from switch SW1, and outputs this signal (usually after filtering) to antenna switch SW6. Antenna switch SW6 may connect first duplexer DUPLEX LB#A1 to main antenna MAIN ANT, depending upon the position of antenna switch SW6.

Main transmitter TX-MAIN also includes a first high band amplifier A2 receiving a first high band signal MAIN-HB and outputting an amplified first high band signal. Switch SW2 receives the amplified first high band signal and outputs signals HB#A1, HB#A2, or HB#A3, depending upon the position of switch SW2. Additional duplexers (similar to DUPLEX LB#A1) are located between the other outputs of main transmitter TX-MAIN and antenna switch SW6, but are represented by three dots for the sake of conciseness. MIMO (second) transmitter TX-MIMO includes a second low band amplifier A3 receiving a second low band signal MIMO-LB and outputting an amplified second low band signal to switch SW3. Switch SW3 outputs an amplified second low band signal LB#B1 or LB#B2, depending upon the position of switch SW3.

Duplexer DUPLEX LB#B1 receives amplified second low band signal LB#B1 and outputs this signal (usually filtered) to antenna switch SW7. Antenna switch SW7 may connect duplexer DUPLEX LB#B1 to MIMO antenna MIMO ANT, depending upon the position of antenna switch SW7.

As illustrated by the dashed lines, first power manager PM1 provides a first power voltage Vcc1 to amplifiers A1 and A2 (in main transmitter TX-MAIN), and to ultrahigh band amplifier A5 (in ultrahigh band transmitter TX-UHB). These power voltages generally are received by the collector of an amplifier, and provide power for the amplifier. For this reason, voltage Vcc1 is described as a first power voltage.

As illustrated by the dotted lines, second power manager PM2 provides a second power voltage Vcc2 to amplifiers A3 and A4 (in MIMO transmitter TX-MIMO).

Thus, the conventional circuitry of FIG. 1 provides the same first power voltage Vcc1 to the first low band amplifier A1 and to the first high band amplifier A2 (both inside of the main transmitter TX-MAIN). The conventional circuitry cannot provide different power voltages to different amplifiers inside of the main transmitter TX-MAIN.

The control system CS may be located outside of ultrahigh band transmitter TX-UHB, in any convenient location. (Not shown.)

Figure 2:
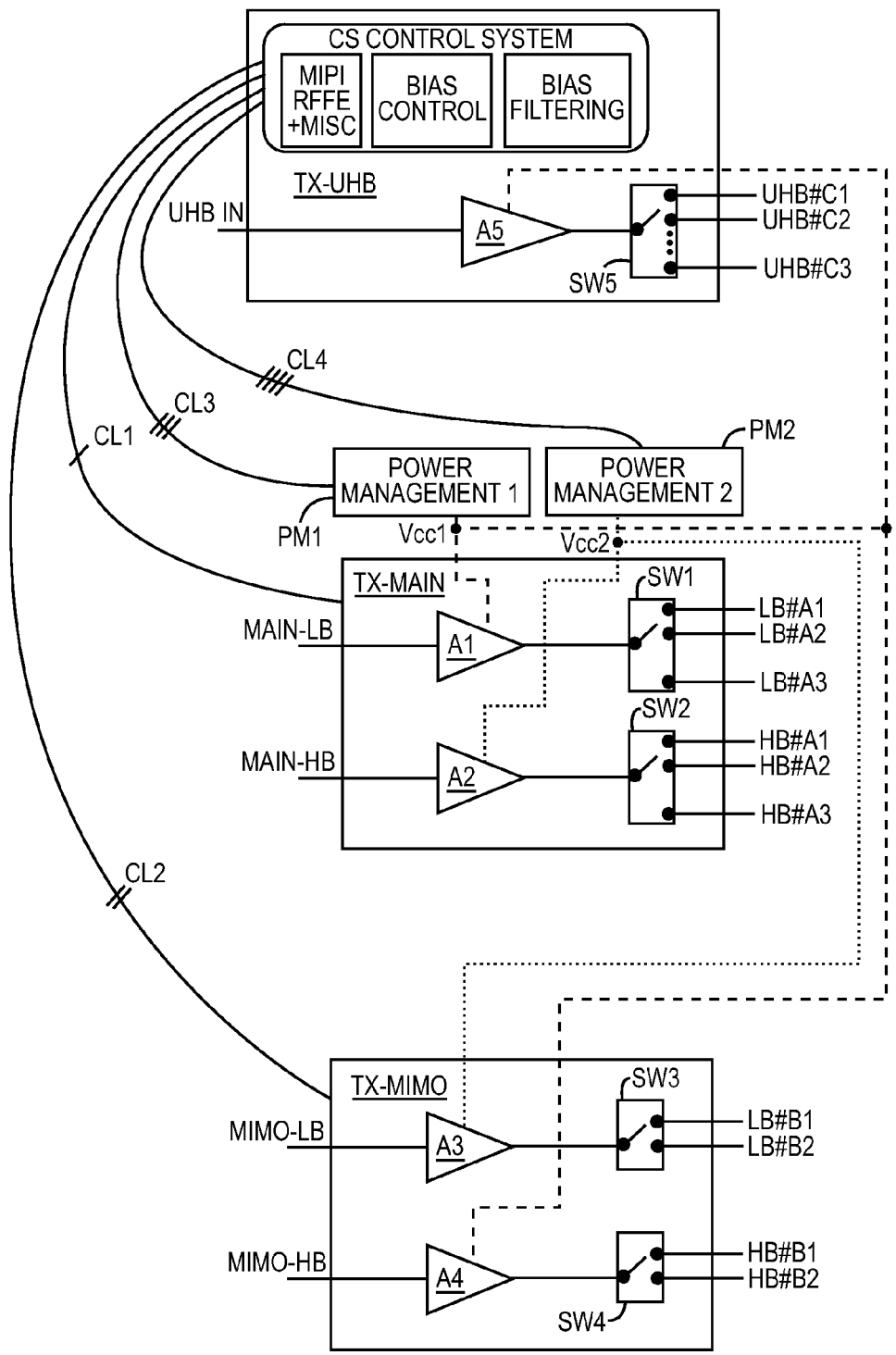
FIG. 2 illustrates a first embodiment.

FIG. 2 illustrates a first embodiment. FIG. 2 is very similar to FIG. 1, but includes important differences as described below. Antenna switches SW6, SW7, and antennas MAIN ANT and MIMO ANT are omitted from FIG. 2 for the sake of conciseness and clarity.

Specifically, in FIG. 2 the first power manager PM1 provides a first power voltage Vcc1 to the first low band amplifier A1, to the second high band amplifier A4, and to the ultrahigh band amplifier A5.

Also, in FIG. 2 the second power manager PM2 provides a second power voltage Vcc2 to the first high band amplifier A2 and to the second low band amplifier A3.

The relative changes from FIG. 1 to FIG. 2 can be summarized as follows. Relative to FIG. 1, FIG. 2 changed the power voltage of first high band amplifier A2 from Vcc1 to Vcc2. Also relative to FIG. 1, FIG. 2 changed the power voltage of second high band amplifier A4 from Vcc2 to Vcc1.

Thus, in the main transmitter TX-MAIN of FIG. 2, the first low band amplifier A1 is powered by Vcc1 from first power manager PM1, and the first high band amplifier A2 is powered by Vcc2 from second power manager PM2. Vcc1 may be different from Vcc2, so these two amplifiers in TX-MAIN may be powered by different power voltages (this is not possible in the conventional circuit of FIG. 1).

Also, in the MIMO transmitter TX-MIMO of FIG. 2, the second low band amplifier A3 is powered by Vcc2 from second power manager PM2, and the second high band amplifier A4 is powered by Vcc1 from the first power manager PM1. Vcc1 may be different from Vcc2, so these two amplifiers in TX-MIMO may be powered by different voltages (this is not possible in the conventional circuit of FIG. 1).

These power management changes of FIG. 2 are supported by logical instructions stored in control system CS in FIG. 2. These logical instructions may be stored in a non-transitory storage medium such as a flash memory. Alternatively, these logical instructions may be permanently stored by hardware circuitry.

Figure 3:
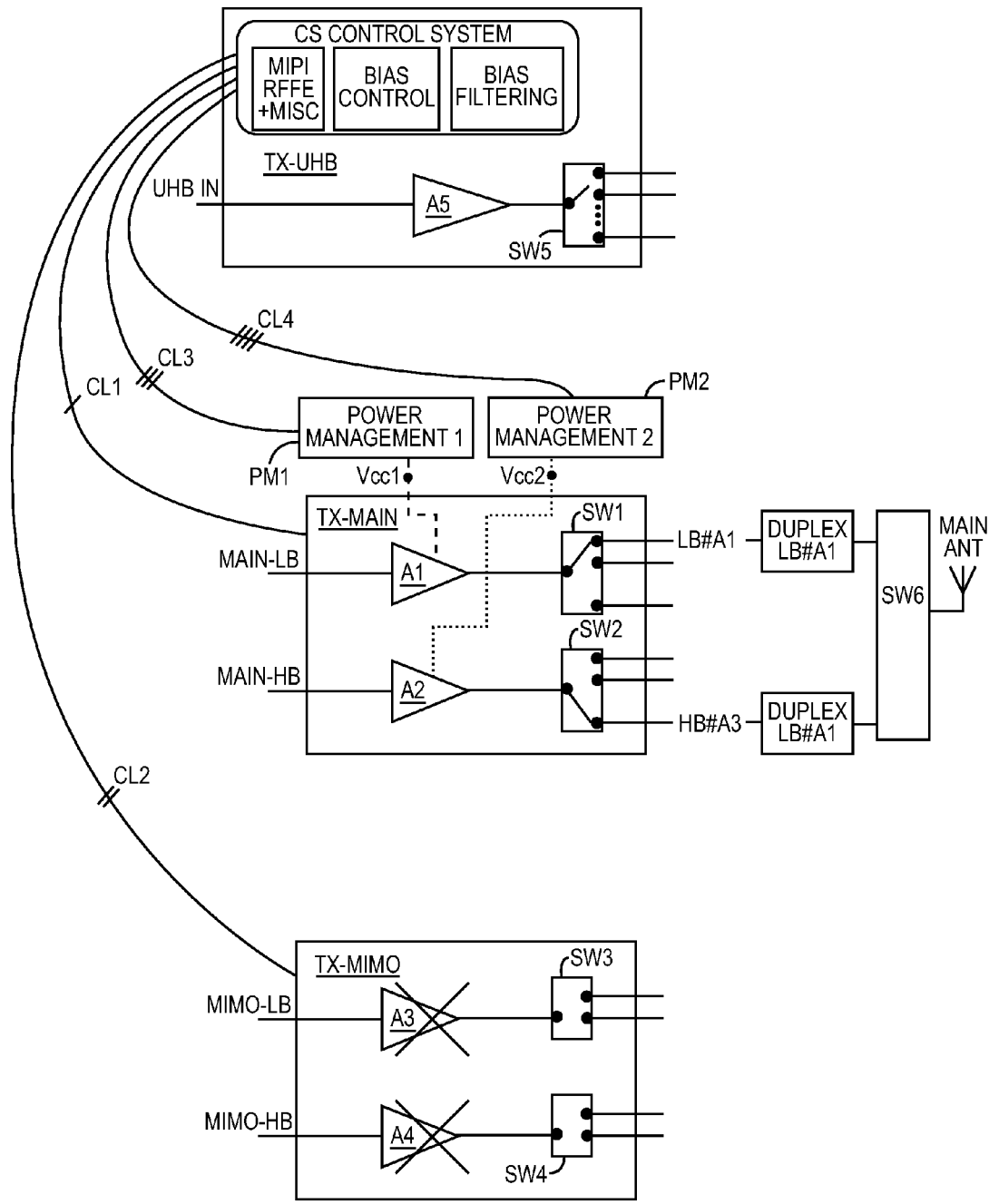
FIG. 3 illustrates a second embodiment including power management in an uplink carrier aggregation transmission mode for the main transmitter.

FIG. 3 illustrates a second embodiment, and illustrates power management in an uplink carrier aggregation (UL CA) transmission mode for the main transmitter.

FIG. 3 is identical to FIG. 2, except for the following changes. First low band switch SW1 is toggled to output LB#A1 in a first band or frequency range, and first high band switch SW2 is toggled to output HB#A3 in a second band or frequency range. These two outputs may be individually duplexed and filtered, then combined (carrier aggregation) in switch SW6, and finally the aggregation may be transmitted (uplinked) through the main antenna MAIN ANT.

These two signals (MAIN-LB and MAIN-HB) are different frequencies in different bands, and generally (but not necessarily) contain different information. These two signals are aggregated and uplinked through the main antenna MAIN ANT.

A communication device operates efficiently if low power voltages (instead of high power voltages) are supplied to amplifiers that only require low amplification. The conventional circuit of FIG. 1 cannot operate efficiently during uplink carrier aggregation because the same power voltage (Vcc1) is provided to amplifiers A1 and A2.

In FIG. 3, first low band amplifier A1 is powered by voltage Vcc1 from the first power manager PM1, and first high band amplifier A2 is powered by voltage Vcc2 from the second power manager PM2. These voltages are not necessarily equal.

For example, first low band amplifier A1 may require low amplification (and thus only require a low power voltage from Vcc1) to communicate with a nearby target, whereas first high band amplifier A2 may require high amplification (and thus require a high power voltage from Vcc2) to communicate with a distant target. In this case, Vcc1<Vcc2, thereby minimizing power consumption by first low band amplifier A1.

In FIG. 3, the path from Vcc1 to second high band amplifier A4 and the path from Vcc2 to second low band amplifier A3 are not shown, to emphasize that no power is drawn by these TX-MIMO amplifiers in the case of an uplink carrier aggregation (UL CA) transmission mode for the main transmitter.

In one embodiment, no power is drawn by amplifiers A3 and A4 due to one or more of the following four factors: input signal MIMO-LB has been turned off, input signal MIMO-HB has been turned off, second low band amplifier A3 has been turned off by adjusting its bias, and/or second high band amplifier A4 has been turned off by adjusting its bias. These factors may be controlled by control system CS, especially the bias of the amplifiers. Detailed discussion of adjusting bias is provided in the discussion of FIG. 6.

When amplifiers A3 and A4 are turned off using these factors, then it is not necessary to provide switches in the paths between the power managers and these amplifiers. Avoiding these switches avoids power losses (and conserves valuable space), especially because these switches would have to be relatively large to handle the large power being consumed by the amplifiers.

Power is very efficiently used in this embodiment because: first low band amplifier A1 requires low amplification and is only provided with a small Vcc; first high band amplifier A2 requires high amplification and is provided with a large Vcc2; and amplifiers A3 and A4 are effectively turned off by turning off the input signal and/or controlling the bias. A similar analogous efficient embodiment occurs when first low band amplifier A1 requires high amplification and first high band amplifier A2 requires low amplification.

Control system CS may contain instructions in a non-transient storage medium that, when executed: turn off amplifiers A3 and A4, adjust the power managers as described above, and switch the switches as described above. Alternatively, control system CS may contain hardware configured to perform some or all of the same functions.

An analogous situation (not shown) may be created for uplink carrier aggregation (UL CA) using the MIMO antenna. In this case, power voltage would flow to second low band amplifier A3 from Vcc2, and to second high band amplifier A4 from Vcc1. Again, Vcc1 does not have to equal Vcc2. Amplifiers A1 and A2 may be turned off using four factors similar to those discussed above (turning off the inputs and adjusting the biases). Again, one of the operating amplifiers (A3 and A4 in this analogous case) may only require small amplification (thus a small power voltage), and another may require large amplification (and thus a large power voltage).

Figure 4:
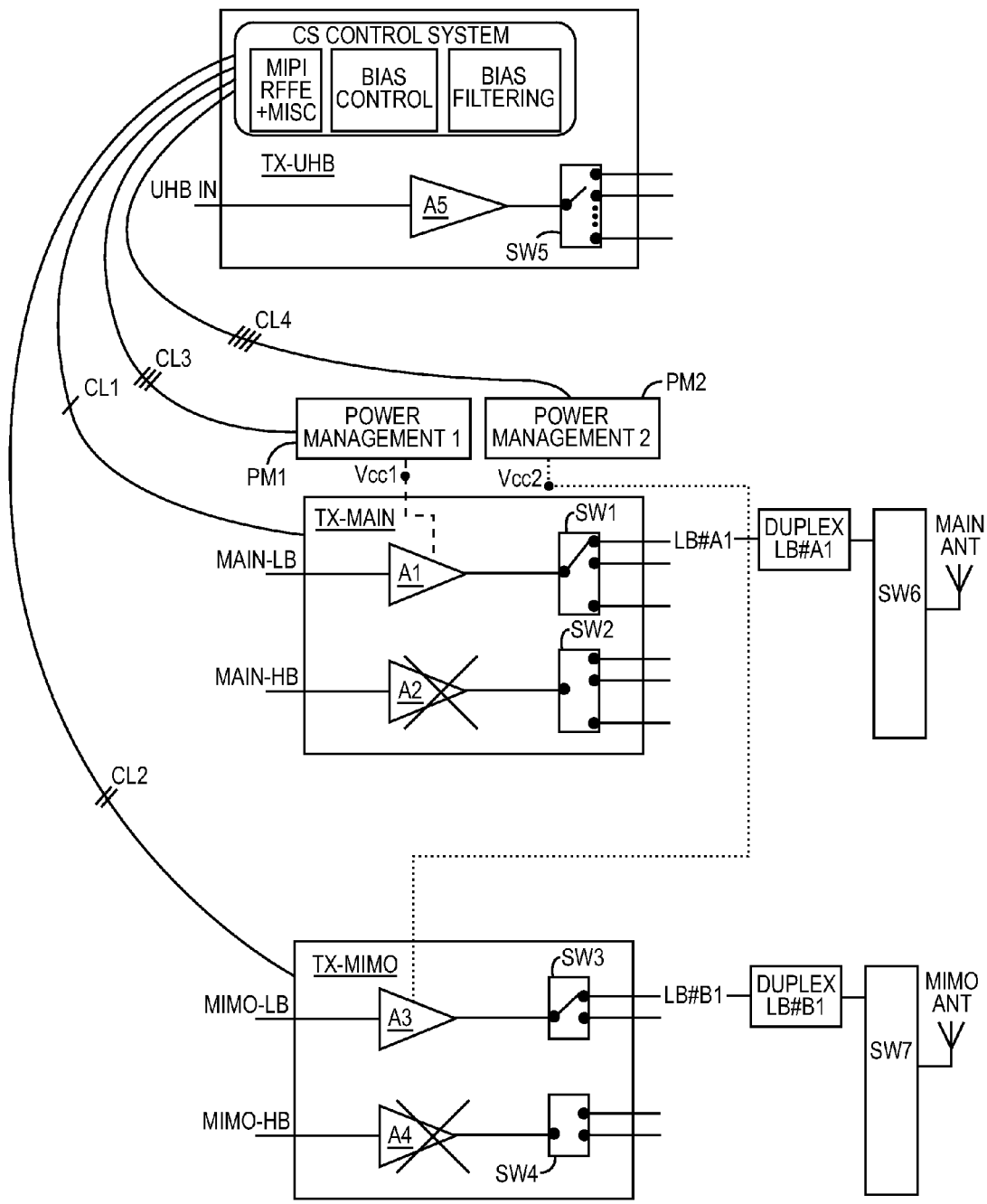
FIG. 4 illustrates a third embodiment including power management in an uplink MIMO transmission mode for low bands.

FIG. 4 illustrates a third embodiment including power management in an uplink MIMO transmission mode for low bands. Before discussing FIG. 4 in detail, it is useful to discuss the terms "MIMO," "transmit diversity," "transmit MIMO," and "uplink MIMO."

"MIMO" means "multiple input, multiple output." For example, in FIG. 1 there are multiple inputs (e.g., MAIN-LB, MAIN-HB, MIMO-LB, and MIMO-HB), and multiple outputs (e.g., MAIN-ANT and MIMO-ANT).

"Transmit diversity" (in the case of two antennas) means transmitting exactly the same signal (same frequency, same band, and same information) using two different antennas. For example, in FIG. 1, an identical low band signal may be sent to MAIN-LB (then amplified by first low band amplifier A1 and transmitted by main antenna MAIN ANT) and sent to MIMO-LB (then amplified by second low band amplifier A3 and transmitted by MIMO antenna MIMO ANT. Thus, a receiving station may elect to receive from either antenna, depending upon which transmitted signal was better received. For example, if a user is holding a communication device a certain way in his hand, then the MIMO antenna may be more effective than the main antenna. The term "transmit diversity" also similarly applies to 3 or more antennas, each transmitting the exact same signal, although this is not common.

"Transmit MIMO" means (in the case of two antennas) transmitting two signals having the same frequency in the same band using two antennas, but each signal having slightly different information. Starting with original data, a first signal includes a first portion of the original data (but not all of the original data), and a second signal includes a second portion of the original data (but not all of the original data). Combined, the first and second signals include all of the original data. Some original data (but not all of the original data) may be redundantly contained in the first signal and the second signal. Thus, in "transmit MIMO" a receiving station must receive at least some of the first signal and at least some of the second signal (in the case of two antennas) in order to reconstruct the original data. In contrast, during "transmit diversity" each signal contains all of the original data.

The term "transmit MIMO" also similarly applies to using three or more signals with corresponding three or more antennas, although this is not common.

"Uplink MIMO" means the same as "transmit MIMO," and is used interchangeably.

Returning to FIG. 4, this figure illustrates uplink MIMO for low bands. FIG. 4 is very similar to FIG. 2, but with the following differences. High band amplifiers A2 and A4 are turned off by turning off their respective inputs and/or their respective biases. These amplifiers are still connected to power manager PM2 and PM1 respectively, but no power is drawn by high band amplifiers A2 and A4 (because they are turned off), so the paths from Vcc2 to A2 and from Vcc1 to A4 are not shown in FIG. 4. Similar to the discussion in FIG. 3, it is not necessary to place switches in these paths, because high band amplifiers A2 and A4 may be turned off by other procedures.

In FIG. 4, the first and second transmit MIMO signals (MAIN-LB and MIMO-LB) are amplified by amplifiers A2 and A3 respectively, switched through switches SW1 and SW3 respectively, and transmitted through antennas MAIN ANT and MIMO ANT respectively. As discussed above, these two transmit MIMO signals are slightly different, and both signals must be received in order to reconstruct the original data.

Control system CS may contain instructions in a non-transient storage medium that, when executed: turn off high band amplifiers A2 and A4, adjust the power managers as described above, and switch the switches as described above. Alternatively, control system CS may contain hardware configured to perform some or all of the same control functions.

Figure 5:
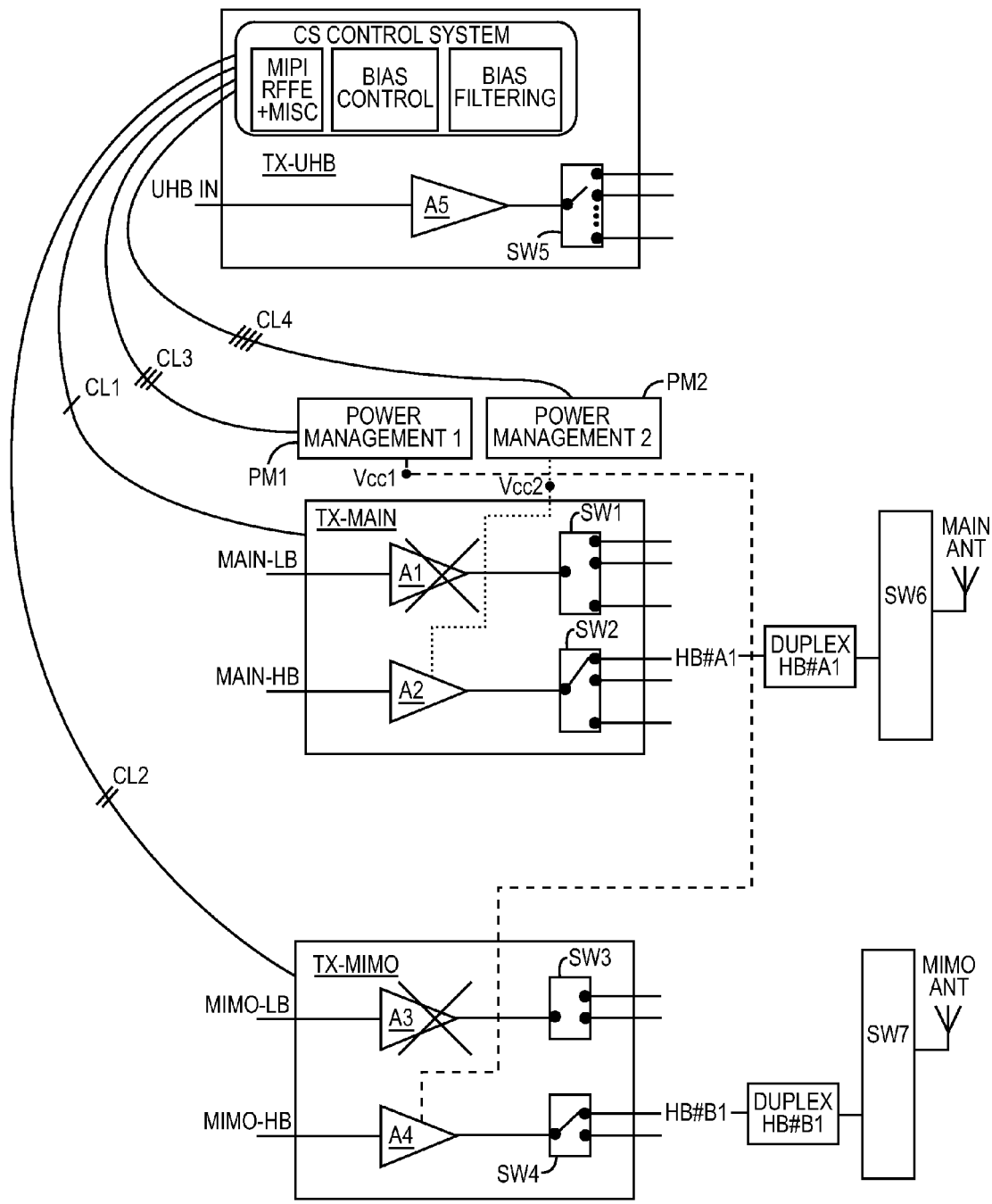
FIG. 5 illustrates a fourth embodiment including power management in an uplink MIMO transmission mode for high bands.

FIG. 5 illustrates a fourth embodiment including power management in an uplink MIMO transmission mode for high bands.

FIG. 5 is very similar to FIG. 2, with the following differences. Low band amplifiers A1 and A3 are turned off by turning off their respective input signals (MAIN-LB and MIMO-LB) and/or adjusting their biases. Low band amplifiers A1 and A3 are still connected to power managers PM1 and PM2 respectively, but no power is drawn by low band amplifiers A1 and A3 (because they are turned off), so the power voltage paths from Vcc1 to first low band amplifier A1 and from Vcc2 to second low band amplifier A3 are not shown. Similar to the discussion in FIG. 3, it is not necessary to place switches in these paths, because low band amplifiers A1 and A3 may be turned off by other procedures.

Control system CS may contain instructions in a non-transient storage medium that, when executed: turn off low band amplifiers A1 and A3, adjust the power managers as described above, and switch the switches as described above. Alternatively, control system CS may contain hardware configured to perform some or all of the same functions.

Figure 6:
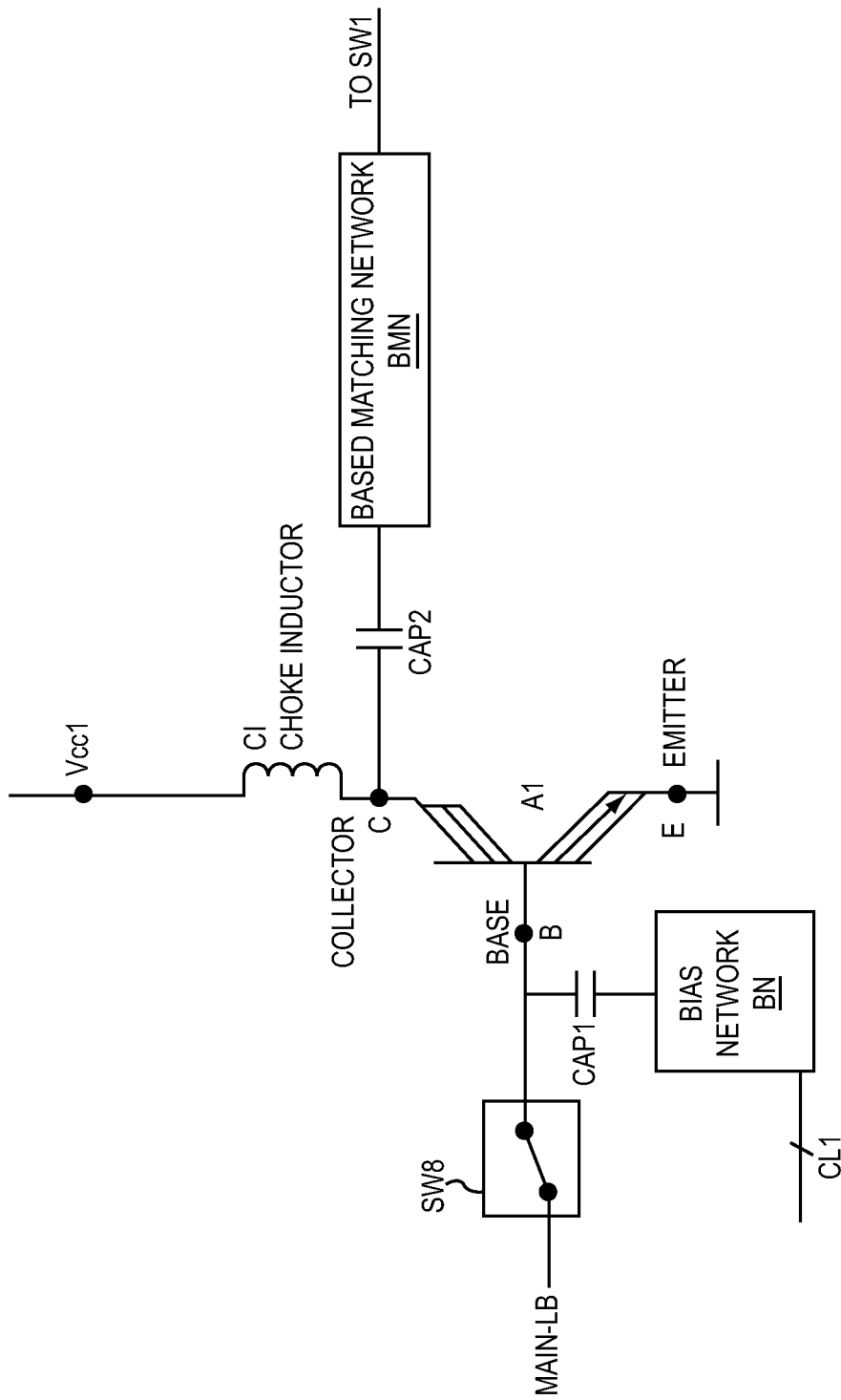
FIG. 6 illustrates technical details for shutting off an exemplary amplifier A1.

FIG. 6 illustrates an exemplary technical embodiment of first low band amplifier A1. This amplifier may be a bipolar transistor such as an HBT (heterojunction bipolar transistor) using GaAs or SiGe. Alternatively, CMOS (complementary metal oxide semiconductor) transistors or pHEMT (pseudomorphic high-electron-mobility transistors) may be used.

In FIG. 6, first low band amplifier A1 includes a bipolar transistor with a collector node C, a base node B, and an emitter node E.

First power voltage Vcc1 provides voltage and power to first low band amplifier A1 through a choke inductor C1. First low band input signal MAIN-LB is provided to base node B (optionally through a switch SW8 that can shut off this input).

Bias network BN biases the input signal MAIN-LB through capacitor CAP1. The bias network BN can turn off the base current of the transistor, thus the collector current will be zero or OFF. In other words, the transistor acts like a switch in OFF position (relative to current or power from Vcc1) since no current flows into its collector when the transistor is biased to be OFF.

Bias network BN may be controlled by the control system CS through control line CL1 as shown. Alternatively (not shown), the bias network BN may be part of the control system, and control line CL1 may connect the control system CS to base node B.

Capacitor CAP2 and based matching network BMN connect collector node C to switch SW1 (not shown).

Those skilled in the art will recognize improvements and modifications to the preferred embodiments of the present disclosure. All such improvements and modifications are considered within the scope of the concepts disclosed herein and the claims that follow.

What is claimed is:

1. A communication device comprising:
 a first transmitter including a first low band amplifier and a first high band amplifier;
 a second transmitter including a second low band amplifier and a second high band amplifier;
 a first power manager in communication with the first low band amplifier and with the second high band amplifier;
 a second power manager in communication with the first high band amplifier and with the second low band amplifier;
 a control system in communication with the first transmitter, the second transmitter, the first power manager, and the second power manager.

2. The communication device of claim 1, wherein the control system is configured for uplink carrier aggregation from the first transmitter by being configured to:
 provide a first power voltage from the first power manager to the first low band amplifier; and
 provide a second power voltage from the second power manager to the first high band amplifier.

3. The communication device of claim 2, wherein the first power voltage does not equal the second power voltage.

4. The communication device of claim 3, further comprising:
 a first antenna switch; and
 a first antenna.

5. The communication device of claim 4, wherein the control system is configured to:
 control the first amplifier to amplify a first low band signal;
 control the second amplifier to amplify a first high band signal;
 control the first antenna switch to aggregate the amplified first low band signal with the amplified first high band signal, and to transmit the uplink carrier aggregation towards the first antenna.

6. The communication device of claim 3, wherein the control system is configured to:
 adjust the first power voltage as a function of a desired amplification of the first amplifier; and
 adjust the second power voltage as a function of a desired amplification of the second amplifier.

7. The communication device of claim 2, wherein the control system is further configured to:
 shut off the second low band amplifier; and
 shut off the second high band amplifier.

8. The communication device of claim 7, wherein:
 shutting off the second low band amplifier is performed by switching off a second low band input; and
 shutting off the second high band amplifier is performed by switching off a second high band input.

9. The communication device of claim 7, wherein:
 shutting off the second low band amplifier is performed by adjusting a bias of the second low band amplifier; and
 shutting off the second high band amplifier is performed by adjusting a bias of the second high band amplifier.

10. The communication device of claim 9, wherein:
 shutting off the second low band amplifier is additionally performed by switching off a second low band input; and
 shutting off the second high band amplifier is additionally performed by switching off a second high band input.

11. The communication device of claim 2, wherein:
 the communication between the first power manager and the second high band amplifier does not contain any switches; and
 the communication between the second power manager and the second low band amplifier does not contain any switches.

12. The communication device of claim 11, wherein:
 the communication between the first power manager and the first low band amplifier does not contain any switches; and
 the communication between the second power manager and the first high band amplifier does not contain any switches.

13. The communication device of claim 1, wherein the control system is configured for low band uplink MIMO (multiple input, multiple output) by being configured to:
 provide a first power voltage from the first power manager to the first low band amplifier; and
 provide a second power voltage from the second power manager to the second low band amplifier.

14. The communication device of claim 13, wherein the first power voltage does not equal the second power voltage.

15. The communication device of claim 14, further comprising:
 a first antenna;
 a first antenna switch;
 a second antenna; and
 a second antenna switch.

16. The communication device of claim 15, wherein the control system is further configured to:
 control the first amplifier to amplify a first low band signal;
 control the third amplifier to amplify a second low band signal;
 control the first antenna switch to pass the amplified first low band signal to the first antenna; and
 control the second antenna switch to pass the amplified second low band signal to the second antenna.

17. The communication device of claim 13, wherein the control system is further configured to:
 shut off the first high band amplifier; and
 shut off the second high band amplifier.

18. The communication device of claim 17, wherein:
 shutting off the first high band amplifier is performed by adjusting a bias of the first high band amplifier; and shutting off the second high band amplifier is performed by adjusting a a bias of the second high band amplifier.

19. The communication device of claim 17, wherein:
shutting off the first high band amplifier is performed by adjusting a bias of the first high band amplifier; and
shutting off the second high band amplifier is performed by adjusting a bias of the second high band amplifier.

20. The communication device of claim 13, wherein:
the communication between the first power manager and the second high band amplifier does not contain any switches; and
the communication between the second power manager and the first high band amplifier does not contain any switches.

21. The communication device of claim 1, wherein the control system is configured for high band uplink MIMO (multiple input, multiple output) by being configured to:
provide a first power voltage to the second high band amplifier;
provide a second power voltage to the first high band amplifier, wherein the first power voltage does not equal the second power voltage;
shut off the first low band amplifier by adjusting a bias of the first low band amplifier;
shut off the second low band amplifier by adjusting a bias of the second low band amplifier;
transmit an amplified first high band signal towards a first antenna; and
transmit an amplified second high band signal towards a second antenna.

* * * * *

UNITED STATES PATENT AND TRADEMARK OFFICE
CERTIFICATE OF CORRECTION

| | | |
|---|---|---|
| PATENT NO. | : 9,078,211 B2 | Page 1 of 1 |
| APPLICATION NO. | : 14/052221 | |
| DATED | : July 7, 2015 | |
| INVENTOR(S) | : Nadim Khlat | |

It is certified that error appears in the above-identified patent and that said Letters Patent is hereby corrected as shown below:

In the Specification:

In column 3, line 38, replace "AS" with --A5--.

In column 5, line 14, replace "Vcc;" with --Vcc1;--.

Signed and Sealed this
Tenth Day of November, 2015

Michelle K. Lee
*Director of the United States Patent and Trademark Office*